United States Patent
Hogeboom

[11] Patent Number: 6,046,638
[45] Date of Patent: Apr. 4, 2000

[54] RECEIVE AMPLIFIER FOR RECEPTION OF HIGH-SPEED DATA SIGNALS

[75] Inventor: John Gordon Hogeboom, Nepean, Canada

[73] Assignee: Nortel Networks Corporation, Montreal, Canada

[21] Appl. No.: 09/034,906

[22] Filed: Mar. 4, 1998

[51] Int. Cl.$^7$ ...................................................... H03F 3/45
[52] U.S. Cl. .......................... 330/252; 330/253; 330/258; 330/259; 330/9; 330/277
[58] Field of Search ..................................... 330/252, 253, 330/258, 259, 9, 277

[56] References Cited

U.S. PATENT DOCUMENTS

| | | | |
|---|---|---|---|
| 3,986,043 | 10/1976 | Buckley, III et al. | 330/277 |
| 4,264,874 | 4/1981 | Young | 330/277 |
| 4,958,133 | 9/1990 | Bazes | 330/258 |
| 5,252,868 | 10/1993 | Miida et al. | 330/253 |
| 5,381,112 | 1/1995 | Rybicki | 330/258 |
| 5,703,532 | 12/1997 | Shin et al. | 330/258 |

*Primary Examiner*—Michael B. Shingleton

[57] ABSTRACT

A receive amplifier for high-speed data has a differential input stage with a very wide common-mode rejection range and low offset voltage. This input stage interfaces the differential data signals to be received. The input stage is a dual complementary differential configuration of ten MOS transistors preferably connected to provide a pair of differential inputs, a pair of differential outputs, and a single common-mode feedback input. The latter feedback input is used in the preferred embodiment to achieve balance and high common-mode rejection. Two-transistor CMOS inverters are preferably used both as amplifying stages after the input stage and as a feedback amplifier. In alternative embodiments, the nodes connected to the feedback input are instead reconnected to fixed voltages, typically one of the supply voltages or a fixed intermediate voltage, to form two independent amplifiers, one for each input node.

7 Claims, 2 Drawing Sheets

RECEIVE AMPLIFIER FOR RECEPTION OF HIGH-SPEED DATA SIGNALS

FIELD OF THE INVENTION

This invention relates generally to digital data transmission, and more particularly to a receive amplifier for receiving high-speed digital data transmissions.

BACKGROUND OF THE INVENTION

In data transmission, overall power dissipation can be reduced by reducing the signal power until the signal-to-noise ratio drops too low for reliable signal detection or until the increasing receiver gain requires power to increase more rapidly than the transmitter power decreases. Since noise pick-up and offset in the receive amplifier also may be significant or dominant, the receive amplifier can be the major factor in determining both data rate capability and signal level in the transmission channel. Generally, CMOS integrated circuit technology has made it possible to decrease the power dissipation of digital circuitry, while at the same time providing high data rate capability. It is important for all CMOS data transmission circuits to have compatible performance.

In order to avoid excessive power consumption and to minimize electro-magnetic interference (EMI), it is desirable to transmit high rate data at amplitudes corresponding to power on the order of one milliwatt (approximately 300 millivolts into a 100 ohm load, for example), much lower than typical logic levels and power supply voltages. While the maximum amplitude is determined by signal power, the minimum amplitude is limited by total noise pick-up and by receiver power consumption, receiver input offset voltage, and receiver bit rate capability vs. input signal amplitude. Power consumption is important not only in its own right, but also in that it effectively limits minimum signal amplitude because there is little benefit in decreasing signal power below a certain point if doing so requires even greater increase in receiver power to compensate. Because input offset voltage will tend to affect the detected logic state just as will any other form of unwanted input signal, the input offset voltage must be included in a summation of all relevant noise. Reduced amplitude signals typically reduce speed performance, so that the receive amplifier may be the speed-limiting factor in high rate communication links. In addition, in order to realize the full advantages of differential signals, the amplifier must have low common-mode sensitivity and must operate over a relatively wide common-mode range. Thus, the receive amplifier generally plays a key role in the capabilities and limitations of high speed data communications links. Key performance criteria for a high speed data receive amplifier are:

a) high data rate capability, b) low input offset voltage, c) low power dissipation, d) low sensitivity to input amplitude variations, e) low sensitivity to common mode signals, and f) wide common-mode rejection range.

Some data receivers of the prior art have used transient positive feedback to decrease rise and fall times (i.e. with positive feedback applied only for the time required to complete a transition and then shutting off).

PROBLEMS SOLVED BY THE INVENTION

The invention provides a receive amplifier which achieves high speed data reception with low power dissipation and high common-mode rejection, using modern high density low voltage CMOS fabrication processes. The invention also allows a second mode of operation, in which conventional signals, such as those from TTL logic devices can be received using the same input circuitry.

PURPOSE, OBJECTS, AND ADVANTAGES OF THE INVENTION

The purpose of the invention is providing an improved receive amplifier for receiving high-speed digital data transmissions. Specific objects include high data rate capability, low input offset voltage, low power dissipation, low sensitivity to input amplitude variations, low sensitivity to common-mode signals, and wide common-mode rejection range. A related object is a receive amplifier circuit using a minimum number of devices. Another related object is providing such a receive amplifier circuit made using CMOS process technology. Other objects include minimizing susceptibility of the receive amplifier circuit to noise and to external radiation interference. Thus, a related object is a receive amplifier circuit configuration that is fully differential. A further related object is higher characteristic line impedance as provided by differential wiring. A still further related object is substantial mutual cancellation of two matched opposing signals of a differential pair, with respect to coupling to and from other signals, and with respect to coupling to and from the power supply rails. Yet another object is an amplifier with flexibility which allows it to be simply adapted for use for two separate non-differential inputs. Finally, a major object is a particular new interconnection structure of input buffers and output switches in a complementary differential CMOS receive amplifier circuit, as described herein. These and other purposes, objects, and advantages will become apparent from a reading of the following description, along with the accompanying drawings.

SUMMARY OF THE INVENTION

The receive amplifier of this invention uses a novel differential input stage with a very wide common-mode rejection range and low offset voltage. This input stage interfaces the differential data signals to be received. The input stage is a dual complementary differential configuration of ten MOS transistors connected to provide a pair of differential inputs, a pair of differential outputs, and a single common-mode feedback input. The latter feedback input is used to achieve balance and high common-mode rejection. Two-transistor CMOS inverters are used elsewhere as amplifying stages due to their simplicity and high performance. In alternative embodiments, the nodes connected to the feedback input can be reconnected to other fixed voltages, typically the supply voltages, to form two independent amplifiers, one for each input node.

DETAILED DESCRIPTION OF THE PREFERRED EMBODIMENTS

Figure 1:
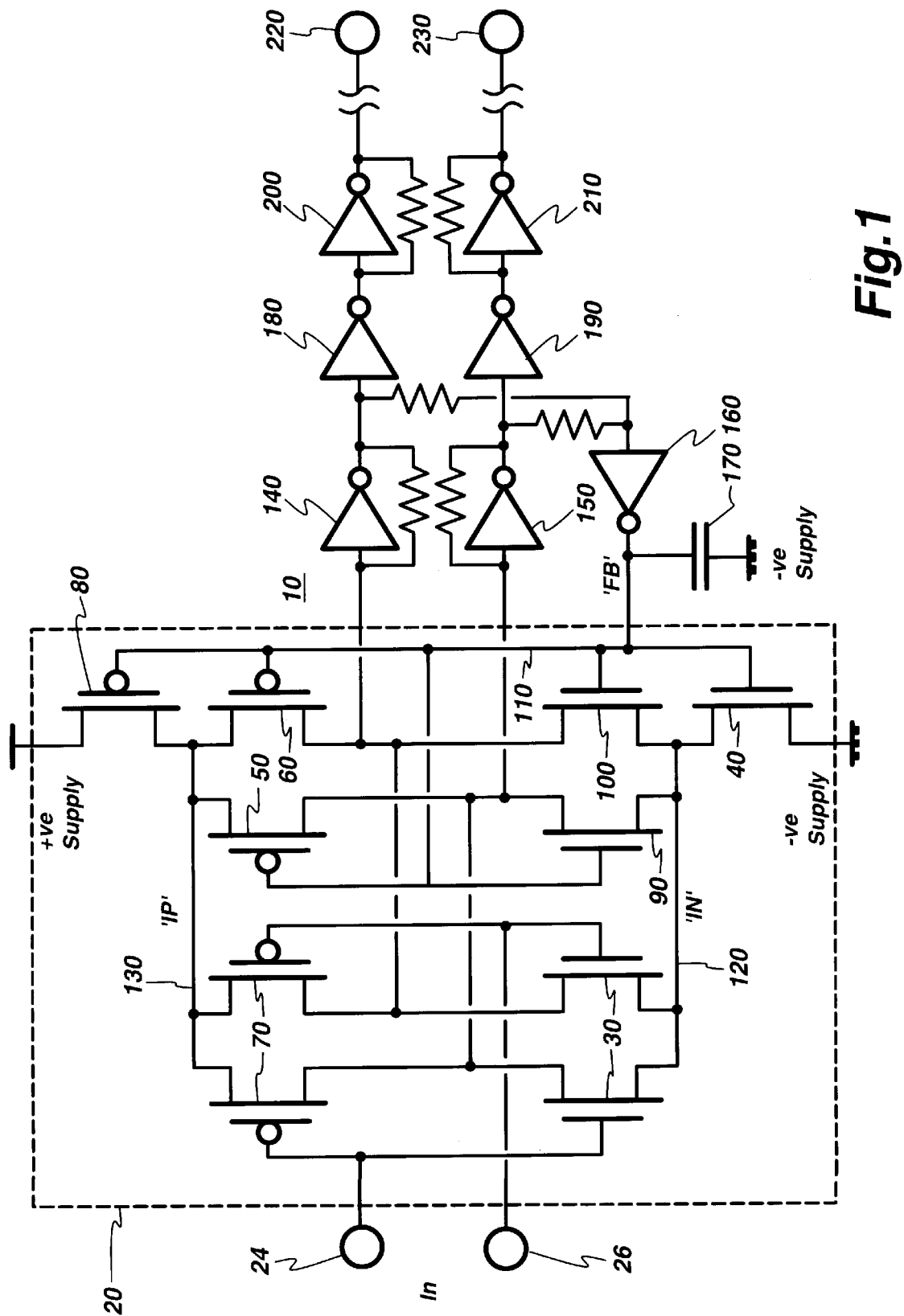
FIG. 1 shows a schematic diagram of a receive amplifier circuit for high speed data, made in accordance with the invention.
Figures 2, 3:
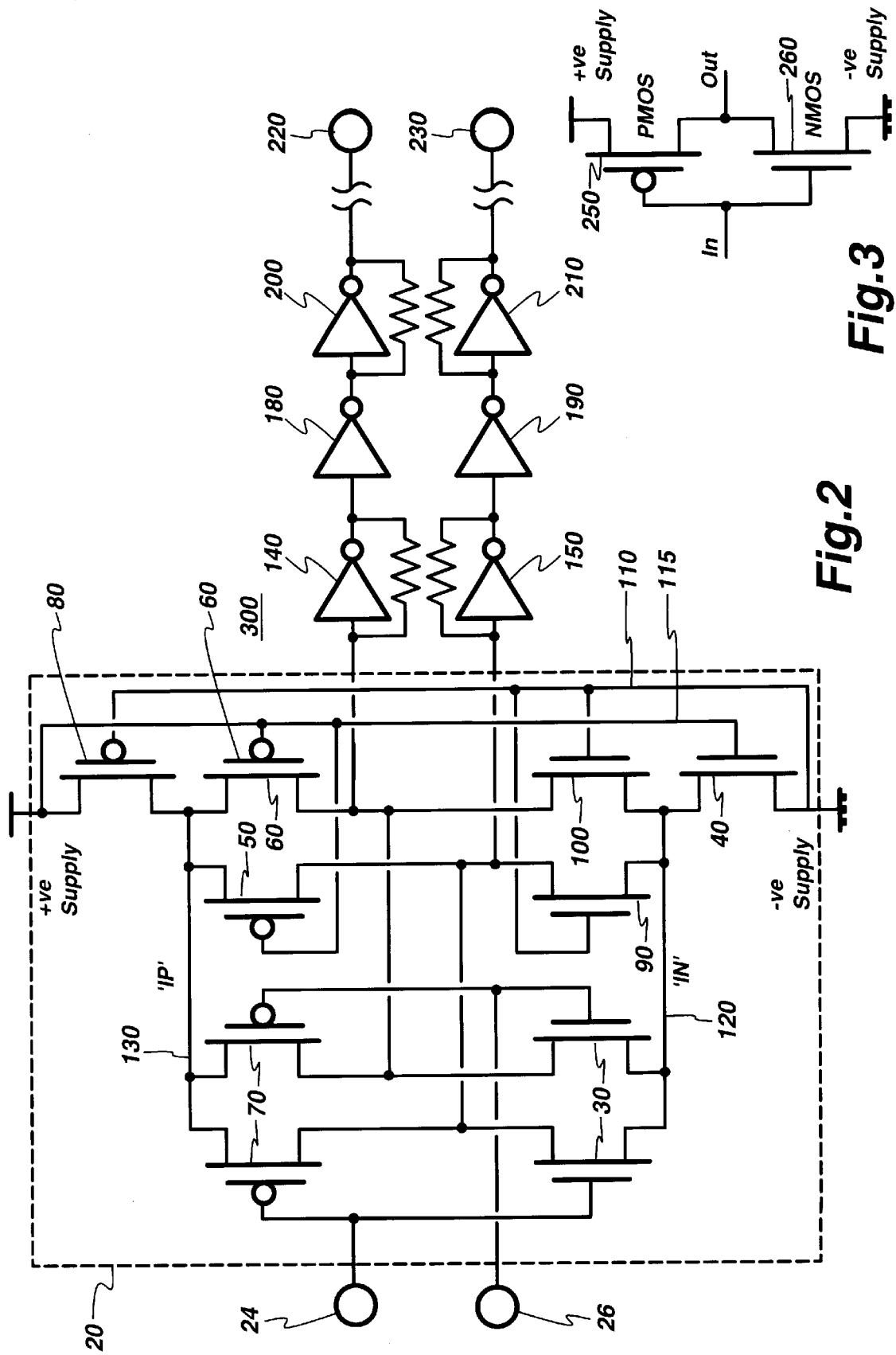
FIG. 2 shows a schematic diagram of an alternative embodiment of a receive amplifier circuit.
FIG. 3 shows a schematic diagram illustrating a detail of FIGS. 1 and 2.

A schematic diagram of a receive amplifier circuit for high speed data, designated generally by reference numeral 10, is shown in FIG. 1. The present invention involves a new CMOS differential input stage combined with subsequent gain stages comprised of CMOS inverters with negative feedback to increase bandwidth and reduce common-mode gain. When used as amplifiers, simple CMOS inverters provide as high a performance and as low power dissipation relative to their performance as is possible with a given CMOS technology. Therefore all gain stages of the data receive amplifier except the first stage are based upon CMOS inverters operated with signals centered on their switching points. By adding negative feedback for each such gain stage, gain is sacrificed for bandwidth but replaced by adding extra stages. Preferably, the gain of each stage is set between 2 and 4, which provides nearly maximum bandwidth yet still allows the required modest gain to be obtained in a few stages. Dual complementary signals are carried through all stages to maintain the differential nature of the amplifier and to allow additional common-mode feedback. This insures that the signals are closely centered on the switching points of each inverter and minimizes overall common-mode gain. A further advantage of dual complementary paths is compatibility with a reconfiguration of the amplifier as two independent input amplifiers for standard logic signals. Such an alternative embodiment is shown in FIG. 2 and described below after completing this description of the differential-input embodiment.

The first (input) stage is key to the amplifier performance, since it receives the smallest signals, yet it must act in a truly differential manner while coping with large common-mode offset and noise. The input stage thus has a significant effect on the signal passed to subsequent gain stages.

The differential input stage 20 of the amplifier is a dual complementary differential structure, with complementary inputs 24 and 26. That is, there is first one N-channel differential pair 30 with common source nodes fed by an N-channel current-limiting device 40 and feeding a load consisting of two P-channel devices 50 and 60. In parallel, there is a completely complementary circuit: a P-channel differential pair 70 with common source nodes fed by a P-channel current-limiting device 80 and feeding a load consisting of two N-channel devices 90 and 100. All four load devices (50, 60, 90, and 100) and both current-limiting devices (40 and 80) share one common gate bias voltage, provided at common-gate-bias node 110 (also denoted 'FB'), which is the common-mode feedback point. The sources of each pair of loads also share the current-limited common source node of the differential pair of the same type, i.e., nodes 120 'IP' and 130 'IN'. Therefore, for each complementary side 30 or 70 there are four identical devices with common sources fed by a current source, two input devices and two load devices, and the circuit is symmetrical about the differential signal halves.

When the common-mode input signal is near mid-rail, both the N-channel and P-channel differential input pairs 30 and 70 conduct and contribute to the signal produced, and both the N-channel (50 and 60) and P-channel (90 and 100) load pairs conduct and largely cancel the currents of one another. When the common-mode input signal is significantly offset from mid-rail, the differential input pair opposing the offset and its complementary load pair conduct most of the current while the remaining four devices conduct little or no current. In any case, the sum of the current passing through input devices is close to being equal to that provided by either of the matched current sources so that gain and maximum output do not change much over the full common-mode range. Because enhancement-mode CMOS devices have a threshold voltage that increases as the source voltage becomes more reverse-biased relative to the substrate, the differential input pairs continue to operate without saturation for input voltages close to the supply rail voltages (or even beyond the supply rail voltages). This provides a large common-mode range extending approximately from the negative supply rail to the positive supply rail.

For limited amplitude high frequency common-mode signals, rejection is obtained primarily by the action of the complementary current sources, which maintain nearly constant total current flowing to the two output nodes and thereby greatly limit common-mode output signal. Of course, these current sources are not ideal in either D.C. or A.C. performance so they do allow some common-mode signal feedthrough. At intermediate and lower frequencies there is further cancellation of common-mode signals by negative feedback to the common-gate-bias node 'FB' 110 mentioned above. The common-mode feedback is taken from the outputs of a second gain stage 140 and 150, through a small inverter 160 used as an amplifier to the common gate node 110.

The common-mode gain of the input stage from node 'FB' 110 is similar to that of a standard inverter in open loop. Therefore the feedback loop has an overall gain of this value, multiplied by the gain of the feedback amplifier 160 (which has similar gain), and by the gain of the second gain amplifier stage (140 and 150), which has considerably less gain due its local feedback, but at least two as mentioned earlier. The overall loop gain is typically 200 to 1000. The feedback amplifier 160 must also be significantly band limited by a capacitive load 170 on its output to avoid instabilities in this relatively high gain feedback loop. Therefore the common-mode feedback has limited effect at high signal frequencies, but reaches an attenuating effect equal to the reciprocal of its loop gain at proportionately lower frequencies. Because it is generally possible to limit common-mode signals in the operating frequency range to less than the amplitude of the differential signals, limited common-mode rejection at high frequencies is acceptable. High common-mode rejection at lower frequencies is important because D.C. and low frequency common-mode signals are often much larger. This receive amplifier is able to reject such D.C. and low frequency common-mode signals well enough that it can operate effectively for inputs over most or all of the range from the positive supply voltage to the negative supply voltage. Subsequent gain stages 180, 190, 200, 210, . . . etc., as well as the previously mentioned second gain stage amplifiers 140 and 150 and the feedback amplifier 160, preferably comprise conventional CMOS inverters, formed by the series connection of the controlled current paths of a PMOS transistor 250 and of an NMOS transistor 260, as shown in the detail schematic, FIG. 3. Output terminals 220 and 230 provide the amplified complementary output signals. In each parallel path of FIG. 1, only every second stage needs feedback because such feedback provides a low input impedance, which limits the gain of the previous stage as well. This completes the detailed description of the embodiment illustrated in FIG. 1.

As mentioned above, a further advantage of dual complementary paths is compatibility with a reconfiguration of the amplifier as two independent non-differential input amplifiers for standard logic signals. This is accomplished, in the basic reconnection scheme, by reconnecting various gates attached to the common-gate-bias node 110 to either a positive or negative supply voltage. This basic reconnection scheme is shown in the alternative embodiment 300 of FIG. 2. The receive amplifier circuit 300 of FIG. 2 has an input stage 20 comprising two independent complementary amplifiers (30 and 70), each amplifier having two complementary load devices (50 and 60, 90 and 100), with each of the complementary load devices having a gate connected to a common-gate-bias-node 110 or 115, a pair of complementary output terminals 220 and 230 for output of amplified data signals, and two current-limiting devices 40 and 80 respectively connected with the complementary load devices of the independent complementary amplifiers of the input stage at the common-gate-bias-nodes. The common-gate-bias nodes 110 and 115 are connected to a predetermined fixed voltage. In FIG. 2, these fixed voltages are the more positive and the more negative supply voltages respectively. As shown in FIG. 2, the subsequent gain stages 180, 190, 200, 210, . . . etc., as well as the second gain stage amplifiers 140 and 150 are used as in FIG. 1. Again, these preferably comprise conventional CMOS inverters, formed by the series connection of the controlled current paths of a PMOS transistor 250 and of an NMOS transistor 260, as shown in the detail schematic, FIG. 3. Output terminals 220 and 230 again provide the amplified output signals.

For the dual-amplifier mode embodiment 300 of FIG. 2, each stage, including the first, is just an inverter. Furthermore, the common-gate-node 115 of device pair 50 and 60 and/or the common-gate-node 110 of device pair 90 and 100 may be connected to some other voltage intermediate between the positive and negative supply voltages to set the input switching point to a higher or lower level respectively. (This level will otherwise be near the midpoint between the supply voltages.) Receive amplifiers using this alternative connection scheme can be used for standard logic input signals from CMOS, TTL, or other logic families.

Thus the receive amplifier of the invention, in its various embodiments, provides a improved circuit useful for reception of high-speed data signals. Its industrial applicability is enhanced by its features of high data rate capability, low input offset voltage, low power dissipation, low sensitivity to input amplitude variations, low sensitivity to common-mode signals, and wide common-mode rejection range.

From the foregoing description, one skilled in the art can easily ascertain the essential characteristics of this invention and, without departing from the spirit and scope thereof, can make various changes and modifications of the invention to adapt it to various usages and conditions. Such other embodiments of the invention will be apparent to those skilled in the art from a consideration of this specification or from practice of the invention disclosed herein. For example, the devices used may be formed using device technologies other than the conventional CMOS technology employed in the illustrated embodiment. It is intended that the specification and examples be considered as exemplar only, with the true scope and spirit of the invention being defined by the following claims and their legal equivalents.

What is claimed is:

1. A receive amplifier circuit for reception of data signals on a channel, comprising in combination:
    a) an input stage differentially responsive to the data signals, said input stage comprising two differential pairs, each differential pair being associated with two complementary load devices, each of said complementary load devices having a gate being connected to a common-gate-bias node;
    b) a pair of complementary output terminals for output of amplified data signals, coupled to said input stage;
    c) two current-limiting devices, each current-limiting device connected to the two complementary load devices of a respective one of the differential pairs, each current-limiting device including a gate connected to said common-gate-bias node;
    d) a common mode voltage source at a location along a signal path between said input stage and said complementary output terminals, said common mode voltage source generating a common mode voltage related to a signal impressed at said complementary output terminals; and
    e) an inverting amplifier connected to said common mode voltage source to feed back the common-mode voltage to said common-gate-bias node.

2. A receive amplifier circuit as recited in claim 1, wherein each of said differential pairs is formed by a complementary pair of transistors.

3. A receive amplifier circuit as recited in claim 1, further comprising at least two gain amplifiers connected in series with said complementary output terminals.

4. A receive amplifier circuit as recited in claim 1, further comprising a capacitive load connected to said inverting amplifier at said common-gate-bias node.

5. A receive amplifier circuit as recited in claim 2, wherein said complementary pair of transistors comprises CMOS transistors.

6. A receive amplifier circuit as recited in claim 3, wherein said at least two gain amplifiers comprise negative feedback amplifiers.

7. A receive amplifier circuit as recited in claim 3, wherein said at least two gain amplifiers comprise CMOS inverters.

\* \* \* \* \*